TRANSISTOR STRUCTURE WITH AN EMITTER REGION
EPITAXIALLY GROWN OVER THE BASE REGION

Filed March 31, 1965

INVENTOR.
FREDERICK H. DILL, JR.

BY John F. Ohlandt Jr.
ATTORNEY

United States Patent Office 3,398,335

Patented Aug. 20, 1968

3,398,335

TRANSISTOR STRUCTURE WITH AN EMITTER REGION EPITAXIALLY GROWN OVER THE BASE REGION

Frederick H. Dill, Jr., Putnam Valley, N.Y., assignor to International Business Machines Corporation, Armonk, N.Y., a corporation of New York Filed Mar. 31, 1965, Ser. No. 446,780
10 Claims. (Cl. 317—235)

ABSTRACT OF THE DISCLOSURE

This is a semiconductor transistor having an emitter epitaxially grown over the base region and at least one ohmic contact to the base region which contact is covered with an insulation layer.

This invention relates to an improved technique for fabricating semiconductor devices, including transistors, and to an improved transistor structure resulting therefrom. More specifically, the invention is concerned with the fabrication of extremely minute semiconductor devices and the circuits integrally constituted by such minute devices.

Recent advances in the semiconductor fabrication art have resulted in the development of techniques for making high frequency transistor devices which typically have dimensions of the order of mils ($10^{-3}$ inches). In making these devices only a very limited area of the base region of the transistor remains exposed so that contact is exceedingly difficult to make to the base region. The present invention is directed to an improvement in the formation of contacts to the base region of such transistor devices.

Accordingly, it is a primary object of the present invention to provide an improved technique for fabricating very small semiconductor devices.

In the so-called planar technique for the manufacture of transistor devices the essential junctions which characterize the devices are defined by the sequential steps of diffusing several impurities through a mask or masks and the junctions thus defined are protected at the surface of the semiconductor body by the aforesaid mask or masks.

As currently practiced this planar technique has the undesirable limitation that the base contact must be fitted between separated mask portions that remain over the respective emitter and collector junctions at the surface of the semiconductor body. The present invention overcomes this limitation by providing a base contact layer situated entirely over the initially exposed area of the base region at the surface of the body. The emitter region is subsequently formed so as to be separated from the base contact layer by an insulating film, as will be described hereinafter.

The significant features and advantages of the present invention are dependent on the fact that the base contact is separated from the emitter by a distance which is based upon the thickness of the aforesaid insulating film rather than by requirements of mask precision and alignment. This allows the separation between the emitter and the base contact to be reduced by about an order of magnitude from about 5 microns (in best practice) to 0.2 micron or less. This allows the so-called external base resistance to be very much reduced. Additionally, the size of the emitter junction is controlled by the size of a hole etched in a film and thus does not depend upon the necessity to register later processing with the opening or hole on the film. This allows emitter openings in the form of an array of small spots or narrow lines and this in turn lowers the base resistance additionally and allows emitter openings narrow enough (0.1 mil) that current crowding will not be important. Current crowding is the concentration of the emitter current at the edges of the emitter junction closest to the base contact.

The foregoing and other objects, features and advantages of the invention will be apparent from the following more particular description of preferred embodiments of the invention, as illustrated in the accompanying drawings.

Figure 1:
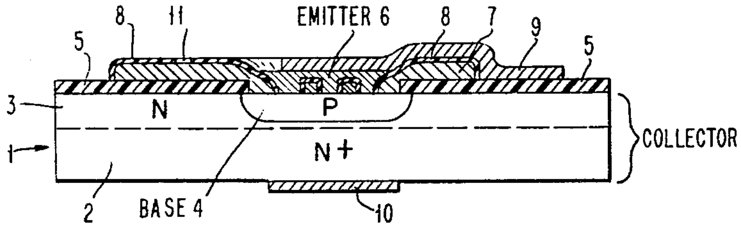
FIGURE 1 is a sectional view of a transistor structure manufactured in accordance with a preferred embodiment of the present invention.

Referring now to FIGURE 1 a transistor structure 1 is shown. This structure may be considered as a segment removed from a large wafer for example, of germanium, or in the case of a monolithic array consisting of a plurality of like structures, the transistor structure 1 is viewed as a single unit thereof. The initial substrate 2 is selected to be of extremely high n type conductiivty, designated by the symbol $n^+$. Immediately contiguous thereto is a region 3 composed of a thin layer which has ben expitaxially formed on the substrate 2 and is likewise of n conductivity type but with a smaller impurity concentration.

Those skilled in the art will recognize the previously described construction as part of what is known as the "epitaxial transistor" design. Part of the region 3 has been converted to the opposite conductivity type, p type in this instance. This region 4 constitutes, in one embodiment, the base region of the transistor. Layer 5 is an insulator, preferably an oxide coating, such as silicon oxide, which acts as a mask and protective agent. The emiter region 6 of the transistor structure 1 is shown in contact with the base region 4 and is separated from the base contact layer 7 by an insulating film 8 formed in a manner to be described hereinafter. A metal layer 9 overlays and makes contact with the emitter region 6 and is disposed over the insulating layer 8 and the insulating layer 5. Ohmic contact 10 is made to the substrate region 2, thus serving as the contact to the collector of the device. A hole 11 is provided through layer 8 to the base contact layer 7 for circuit connecting purposes.

Referring to FIGURES 2A–2D the several stages in the manufacture of a transistor structure, in most respects identical to that shown in FIGURE 1, are illustrated. In this set of figures the structure has been simplified and only an n type substrate, without the epitaxial layer, is considered.

Figure 2A:
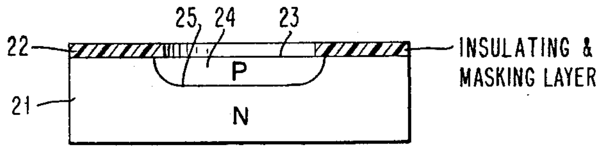
FIGURES 2A–2D are sectional views of a transistor structure at separate stages of manufacture in accordance with the present invention.

In the first stage illustrated by FIGURE 2A an oxide coating or layer 22 is formed into a mask on a wafer 21, the mask having an opening 23 therein. The oxide coating is formed preferably of silicon oxide and many methods of forming such a layer are known in the art; for example, by evaporation onto the wafer or, by pyrolytic decomposition of ethyl silicate vapor on the surface of the crystal wafer. The removal of the oxide layer within the opening 23 is accomplished by photoresist techniques well known to those skilled in the art. The region 24 of p conductivity type is produced in the wafer 21 for example, by diffusion of an acceptor impurity through the opening 23, with application of sufficient heat to raise the wafer to a suitable temperature. A junction 25 is defined by the opposite conductivity type regions 21 and 24. It will be noted that the thickness of the base region 24 is the final thickness for this region— in the preferred case of forming only the emitter epitaxially, as will be described later.

Figure 2B:
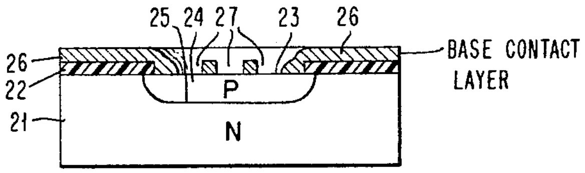

In FIGURE 2B there is shown the addition of a base contact layer 26 formed over the oxide layer 22 and into the original opening 23. This contact layer typically is evaporated onto the wafer. It is made of a material which fulfills two requirements: (1) it must make a good ohmic contact to the base; (2) it must be such that an anodized oxide or other stable insulating film can be formed on the surface. Aluminum would be one such suitable material for the illustrated transistor structure. Other suitable materials include tantalum, nickel and tin.

The base contact layer 26 is then etched using photoresist techniques to (1) delineate the base contact area externally, including the contact pad extended out over the silicon oxide layer and (2) make very small holes or stripes through which the emitter region will be formed. In FIGURE 2B the new holes 27 for the emitter deposition are shown, having been etched into the layer 26.

Although a plurality of emitter holes 27 have been shown as formed in the base contact layer 26 to provide for the emitter deposition, it will be understood that only a single hole is necessary for the deposition.

Figure 2C:
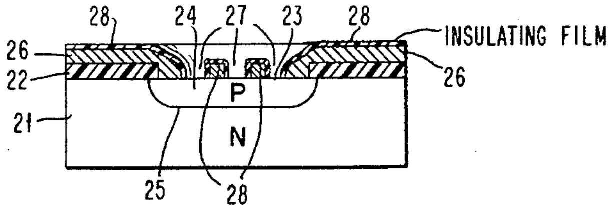
Figure 2D:
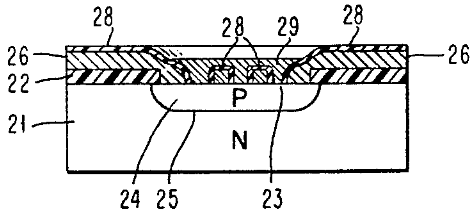

After opening the emitter holes 27 in the aluminum base contact layer 26 the aluminum layer has an insulating film 28 formed over it. This film 28 is formed on the aluminum by a treatment such as anodization or heat treatment in an atmosphere containing hydrogen gas and water vapor. This puts a stable insulating aluminum oxide film, as shown in FIGURE 2C on the aluminum.

After forming the insulating film 28, an n type epitaxial film is grown using the silicon oxide and anodized aluminum for masking. This epitaxial film is achieved preferably by using what is known as a vapor growth technique, such as the halide vapor growth technique exemplified in Patent Number 3,072,507. This epitaxial film is designated 29 in FIGURE 2D and, as shown, has filled in the holes in the aluminum film and is continued, if desired, to actually close across between emitter openings 27. This step forms an emitter region which is insulated from the base contact by the thin (a few hundred to a few thousand angstroms) insulating aluminum oxide layer.

In an alternate arrangement the aluminum base contact layer 26 is first covered with an additional silicon oxide film, before the etching step that is employed to delineate the contact area and emitter junction area, as described previously. The photoresist etching is then done to both films leaving the second silicon oxide layer over the aluminum for better insulation, better vapor growth masking, and to lower capacitance. With this arrangement only the exposed edges of the aluminum layer 26 need have an insulating film formed on them. This film could be rather thin without having an excessive capacitance penalty.

A further alternate method of fabrication of this structure is to make use of a base contact covered with silicon oxide. (The base diffused region in this case will be shallower than the final base thickness.) After opening the emitter holes in the base contact and overyling oxide an epitaxial deposition is performed to extend the base region through the holes, sealing the non-insulated edges of the base contact. The emitter region is then deposited epitaxially as in the previous embodiment. This method of fabrication allows the use of a wider variety of base contact materials than in the preferred embodiment since the need to form an insulating film on the metal is eliminated. It also more easily permits alloying of the base contact, if necessary, to improve its electrical characteristics.

The invention has been described herein with particular reference to a single transistor structure in order to simplify and make clear the concepts thereof. However, it will be appreciated that the principle of the present invention is readily applicable to the formation of integrated arrays of small transistor devices in order to provide, for example, complete transistor logic circuits. The only other requirement that is necessary to realize such circuits is to provide suitable interconnection patterns on the matrix or substrate between individual contact pads that are provided for each unit as described hereinabove.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An improved transistor structure comprising,
a semiconductor wafer of predetermined conductivity type,
an insulating layer located on a portion of a surface of said wafer,
a thin layer of opposite conductivity type at said surface of said wafer, said insulating layer protecting the junction defined by said layer of opposite conductivity type and said wafer of predetermined conductivity type,
a metal layer, having apertures therein, disposed over said thin surface layer and providing a plurality of ohmic contacts thereto,
a further layer of semiconductor material, disposed in said apertures and defining a junction with said thin surface layer, and separated from said metal layer by the thickness of an insulating film thereon, and
an additional metal layer over said last formed semiconductor layer.

2. An improved transistor structure comprising,
a semiconductor wafer having a plane surface,
a first zone extending into said wafer from said plane surface,
a metal contact layer to said first zone, said metal layer being disposed over an insulating coating protecting the junction defined between the bulk of said wafer and said first zone, and
an insulating film disposed over said metal contact layer, said metal contact layer containing apertures in which semiconductor material is disposed, said metal contact layer providing a plurality of ohmic contacts to said first zone, said semiconductor material being separated from said metal contact layer by said insulating film.

3. An improved transistor structure comprising,
a semiconductor wafer having a plane surface,
a base zone extending into said wafer from said plane surface,
a metal contact layer to said base zone, said metal layer being disposed over an insulating coating protecting the junction defined between the bulk of said wafer and said base zone, and
an insulating film disposed over said metal contact layer, said metal contact layer containing apertures in which semiconductor material is disposed, said metal contact layer providing a plurality of ohmic contacts to said base zone, said semiconductor material constituting the emitter region and being separated from said metal contact layer by said insulating film.

4. An improved transisotr structure comprising,
a semiconductor wafer of predetermined conductivity type, having a plane surface,
a base zone of opposite conductivity type extending onto said wafer from said plane surface,
a metal contact layer to said base zone, said metal layer being disposed over an insulating coating protecting the junction defined between the bulk of said wafer and said base zone, and
an insulating film disposed over said metal contact layer, said metal contact layer containing apertures in which semiconductor material is disposed, said metal contact layer providing a plurality of ohmic contacts to said base zone, said semiconductor material constituting the emitter region and being separated from said metal contact layer by said insulating film.

5. An improved transistor structure as defined in claim 4 wherein the semiconductor wafer is constituted of germanium of n conductivity type, the base region is p conductivity type, the metal layer is of aluminum and the insulating film on said metal layer is of aluminum oxide.

6. A transistor comprising, a semiconductor body having a plane surface and an insulating layer located on a portion of said surface of said body, said semiconductor body having a diffused base region extending into the body from said plane surface, said insulating layer protecting the junction formed by said base region and said body, a metal contact layer disposed over the surface area of said base region providing a plurality of ohmic contacts to said base region, said metal layer having apertures therein, and an epitaxially grown emitter region formed in said apertures and defining a junction with said base region, said emitter region being separated from said metal layer by the thickness of an insulating film thereon.

7. A transistor comprising, a semiconductor body having a plane surface and an insulating layer located on a portion of said surface of said body, said semiconductor body having a diffused base region extending into the body from said plane surface, said insulating layer protecting the junction formed by said base region and said body, a metal contact layer disposed over the surface area of said base region providing a plurality of ohmic contacts to said base region, said metal layer having apertures therein, and an epitaxially grown emitter region formed in said apertures and defining a junction at the plane surface with said base region, said emitter region being separated from said metal layer by the thickness of an insulating film thereon.

8. A transistor as defined in claim 7 wherein the semiconductor body is constituted of germanium of n conductivity type, the metal layer is of aluminum and the insulating film on said metal layer is of aluminum oxide.

9. A transistor device comprising, in combination, a semiconductor wafer having a plane surface;

an insulating layer located on said plane surface of said wafer, said insulating layer having at least one aperture therein;

a base zone extending into said wafer from said plane surface and located substantially beneath said aperture; said insulating layer protecting the junction formed by said base region and said wafer, a metal contact layer disposed over said insulating layer and in contact with said base zone, said metal contact layer having at least one aperture located within the area defined by the aperture of said insulting layer;

an insulating film disposed over said metal contact layer;

an epitaxial grown monocrystalline emitter region located on said base zone surface and extending above a portion of said metal contact layer and disposed in said aperture of said metal contact layer and electrically isolated from said metal contact layer by said insulating film; and an additional metal layer located on said insulating film and in ohmic contact with said epitaxial emitter region.

10. A transistor device in accordance with claim 9 wherein the semiconductor material of said wafer and said emitter and base regions is germanium.

References Cited

UNITED STATES PATENTS

| | | | |
|---|---|---|---|
| 3,237,271 | 3/1966 | Arnold et al. | 29—25.3 |
| 3,189,973 | 6/1965 | Edwards et al. | 29—25.3 |

JOHN W. HUCKET, *Primary Examiner.*

M. EDLOW, *Assistant Examiner.*